United States Patent [19]

Kim

[11] Patent Number: 5,619,065

[45] Date of Patent: Apr. 8, 1997

[54] SEMICONDUCTOR PACKAGE AND METHOD FOR ASSEMBLING THE SAME

[75] Inventor: Young S. Kim, Seoul, Rep. of Korea

[73] Assignee: Gold Star Electron Co., Ltd., Chungcheongbuk-do, Rep. of Korea

[21] Appl. No.: 308,624

[22] Filed: Sep. 19, 1994

Related U.S. Application Data

[63] Continuation of Ser. No. 940,327, Sep. 3, 1992, abandoned.

[30] Foreign Application Priority Data

Sep. 11, 1991 [KR] Rep. of Korea ............... 15864/1991

[51] Int. Cl.$^6$ .................. H01L 23/495; H01L 23/48; H01L 23/52
[52] U.S. Cl. ................. 257/673; 257/674; 257/692; 257/696; 257/790
[58] Field of Search .................. 257/734, 673, 257/674, 692, 696, 773, 666, 790; 437/209

[56] References Cited

U.S. PATENT DOCUMENTS

| | | | |
|---|---|---|---|
| 3,778,685 | 12/1973 | Kennedy | 257/790 |
| 3,795,044 | 3/1974 | Peltz | 29/591 |
| 4,210,926 | 7/1980 | Hacke | 257/673 |
| 4,711,700 | 12/1987 | Cusack | 156/651 |
| 4,733,292 | 3/1988 | Jarvis | 257/666 |
| 4,788,583 | 11/1988 | Kawahara et al. | 257/790 |
| 4,920,074 | 4/1990 | Shimizu et al. | 437/211 |
| 5,097,317 | 3/1992 | Fujimoto et al. | 257/790 |
| 5,109,270 | 4/1992 | Nambu et al. | 257/673 |
| 5,136,367 | 8/1992 | Chiu | 257/678 |
| 5,221,858 | 6/1993 | Higgins, III | 257/666 |
| 5,270,570 | 12/1993 | Westerkamp | 257/666 |
| 5,286,342 | 2/1994 | Tsuji | 257/666 |

FOREIGN PATENT DOCUMENTS 60-007747  1/1985  Japan ...................... 257/692

*Primary Examiner*—Sara W. Crane
*Assistant Examiner*—David Ostrowski

[57] ABSTRACT

A semiconductor package including a semiconductor chip having at its upper surface a plurality of bonding pads and a tape lead frame having a paddle on which a semiconductor chip is laid, a plurality of inner leads each having a sufficient length to be directly connected with each corresponding bonding pad of the semiconductor chip and a plurality of outer leads each connected with each corresponding inner lead and having a thickness larger than that of the inner lead. The semiconductor chip is die bonded on the paddle of the tape lead frame. An insulating layer is formed over the upper surface of the semiconductor chip except for portions corresponding the bonding pads. Each inner lead has at its one end a bonding bumper for electrically connecting the inner lead with each corresponding bonding pad. Using the epoxy molding compound, the inner leads and the paddle of the tape lead frame, the semiconductor and the insulating layer are molded. Each of the outer leads has a predetermined shaped portion exposed externally from the package.

20 Claims, 15 Drawing Sheets

F I G. 5a
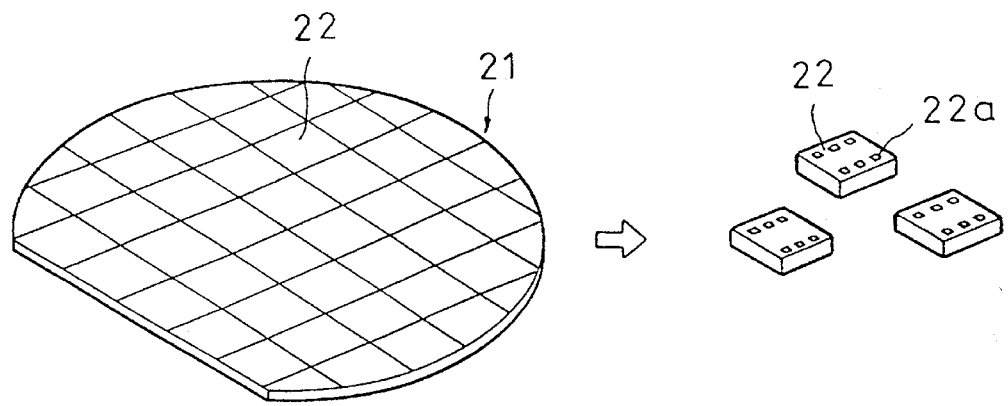
F I G. 5b
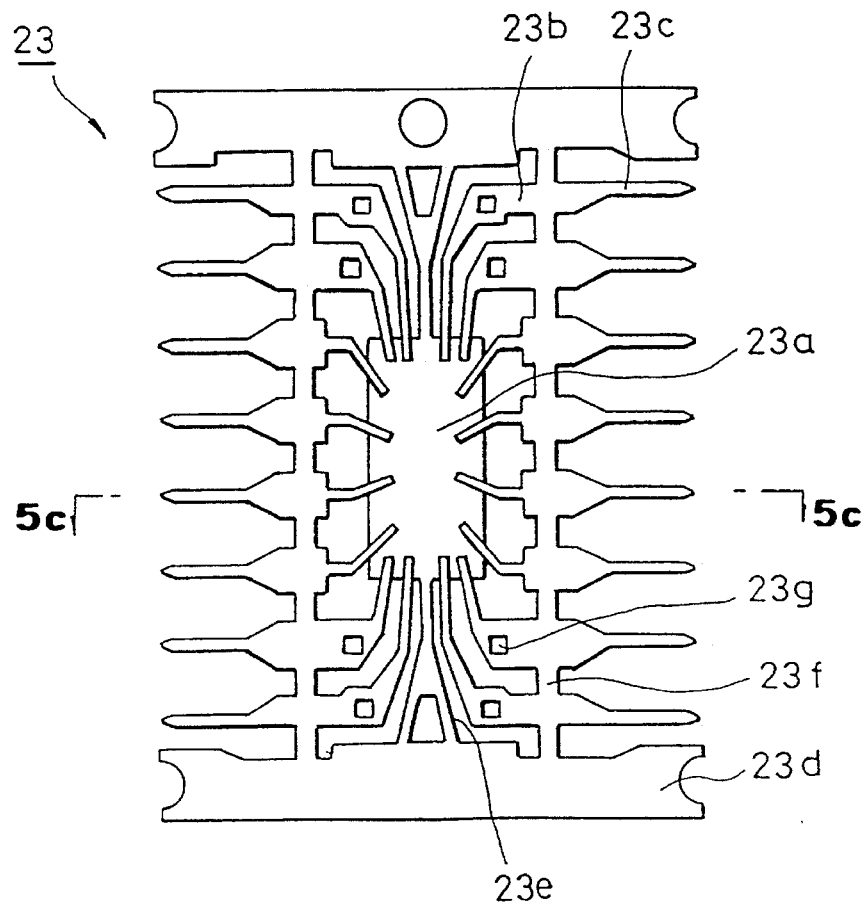

SEMICONDUCTOR PACKAGE AND METHOD FOR ASSEMBLING THE SAME

This application is a continuation of application Ser. No. 07/940,327 filed on Sep. 3, 1992, now abandoned.

BACKGROUND OF THE INVENTION

1. Field of the Invention

The present invention relates to a semiconductor package and a method for assembling the same.

2. Description of the Background Art

Generally, semi conductor packages are classified into two types of packages, that is, a plastic package type and a ceramic package type.

For clarifying an understanding of the present invention easy, methods for assembling the above-mentioned types of packages will now be described. A method for assembling the plastic type package will be first described.

First, a wafer 1 is subjected to a dicing so that it is divided into a plurality of chips 2, as shown in FIG. 1a. The dicing can be achieved by using a chemical method using acetic acid, fluoro acid or the like or a scribing method using a diamond cutter. As shown in FIG. 1b, a lead frame 3 is also prepared. The lead frame 3 comprises a paddle 3a on which one of the chips 2 is laid, a plurality of inner leads 3b electrically connected with the chip 2 inwardly of the package, a plurality of outer leads 3c electrically connected with other elements outwardly of the package, a pair of spaced side rails 3d adapted to maintain the shape of the lead frame 3, dam bars 3e adapted to support the inner and outer leads 3b and 3c such that they are uniformly spaced between the side rails 3d, a pair of support bars 3f adapted to support the paddle 3a between the side rails 3d, and a plurality of locking holes 3g.

Thereafter, a die bonding is carried out for attaching the chip 2 to the paddle 3a, as shown in FIGS. 1c and 1d, FIG. 1d is a cross-sectional view taken along the line a—a' of FIG. 1c. Subsequently, a wire bonding is carried out for electrically connecting bonding pads 2a of the chip 2 with corresponding inner leads 3b by means of wires 4, as shown in FIG. 1e. The bonding pads 2a are generally formed on the surface of chip 2, so as to achieve the wire bonding as mentioned above. They are formed in a double line in case of a dual in line type package and in a single line in case of a single in line type package. The illustrated case corresponds to the dual in line type package.

The lead frame 3 which has been subjected to the die bonding and wire bonding is then positioned in a mold 5 having a mold cavity corresponding a desired shape of a package to be produced, as shown in FIG. 1f. Thereafter, an epoxy molding compound (EMC) 6 is charged into the mold cavity of the mold 5 and a molding is then carried out.

After molding, a trimming is carried out, for removing dam bars 3e from the molded package, as shown in FIG. 1g. Subsequently, a shaping process for shaping the outer leads 3c into a desired shape is performed as shown in FIG. 1h. In case shown in FIG. 1h, the outer leads 3c have a gull wing shape.

FIG. 1l shows the shape of a plastic package obtained by the above-mentioned method.

On the other hand, the ceramic package is used as a package for a charge coupled device (CCD) which is activated generally by receiving a light. The following is a method for assembling such a ceramic package.

First, a powder mixture is prepared by mixing a $Al_2O_3$ compound with a proper additive. Using the powder mixture, several sheets are formed. On each sheet, is formed a metallic pattern for connecting leads with corresponding bonding pads of a chip which is to be laid on a lead frame. Thereafter, the sheets having desired metallic patterns are stacked over one another to form a multi-layered package structure having a desired shape as shown in FIG. 2a. The multi-layered package structure is then subjected to a sintering.

The multi-layered package structure shown fin FIG. 2a comprises three sheets, that, is, a bottom sheet 7, an intermediate sheet, 8 and a top sheet 9.

Thereafter, a die bonding is carried out, for attaching a chip 10 to a required position in the package, as shown in FIG. 2b. A wire bonding is then performed for electrically connecting the metallic patterns with bonding pads 10a of the chip 10 by means of wires 11, as shown in FIG. 2c.

As shown in FIG. 2d, a glass 12 is then covered over an opened area of the package. Subsequently, leads 13 are attached to required portions of opposite outside surfaces of the structure, as shown in FIG. 2e. Thus, a ceramic package is obtained, an inner structure of which is shown in FIG. 2f.

However, the above-mentioned methods for assembling a plastic package and assembling a ceramic package have the following problems.

In case of the plastic package, its manufacturing method is complex, even though the manufacture cost is inexpensive in that the plastic package is made from cheap materials. During the EMC molding following the wire bonding, the bonded wires are likely to be subjected to a sweeping phenomenon which causes them to be swept toward one side or to be broken. As a result, the rate of poor products becomes relatively high.

The method for assembling the ceramic package provides an advantage in case of making packages for semiconductor elements requiring a high precision, in that the ceramic package is made before the die bonding and wire bonding are carried out. However, it has a disadvantage of an expensive manufacture cost.

Moreover, recent technical developments in manufacture of semiconductor elements lead memory chips to be on an increasing trend in capacity. This trend also causes bare chips contained in semiconductor packages to increase in size. As a result, the occupied area of a bare chip in the overall area of the semi conductor package is on an increasing trend.

In addition to the above-mentioned disadvantage encountered in the plastic packages, the use of wires for electrically connecting a chip with leads in cases of the above-mentioned plastic and ceramic packages causes a problem that the packages increase in height and volume. This problem is contrary to efforts for making semiconductor packages light and thin.

As a technique for solving the above-mentioned problems, there has been known a lead on chip (LOC) technique wherein leads are directly connected to a chip, without using a wire bonding. Now, a method for assembling a small outline J (SOJ) type lead package according to the LOC technique will be described.

First, a lead frame is prepared for a LOC-SOJ package using a 16-mega-bit dynamic random access memory (16 M DRAM), as shown in FIG. 3a. In FIG. 3a, the reference numeral 14 is the lead frame, 14a a paddle on which a chip is laid, 14b inner leads, 14c outer leads, 14d dam bars, 14e side rails, 14f support bars, and 14g locking holes.

In this case, each inner lead 14b has the same thickness as that of each outer lead 14c and has a sufficient length so that, its free end can be laid on the upper surface of a chip which is laid on the paddle 14a.

Thereafter, a chip 15 which was previously prepared by dicing a wafer is laid on the paddle 14a of the lead frame 14 and then subjected to a die bonding for attaching the chip 15 to the paddle 14a, as shown in FIGS. 3b and 3c. An insulating layer 16 is coated over the upper surface of chip 15 except, for its portions corresponding to bonding pads 15a. FIG. 3c is a cross-sectional view taken along the line a—a'.

A wire bonding using wires 17 is then carried out for electrically connecting free ends of inner leads 14b with corresponding bonding pads of the chip 15, as shown in FIG. 3d.

Following the die bonding and wire bonding, a trimming is performed for removing dam bars 14d and support bars 14f. Thereafter, the lead frame 14 carrying the chip 15 is positioned in a mold 18. At this time, outer leads 14c of the lead frame 14 are positioned outwardly of the mold 18. An ENC 19 is charged into a mold cavity of the mold 18 and a molding is then carried out, as illustrated in FIG. 3e.

After molding, a shaping process for bending the outer leads 14c into a J-shape is performed as shown in FIG. 3f. Thus, a LOC-SOJ type package is obtained.

Such a LOC-SOJ type package has an advantage of providing a large area of inner leads occupied in the package, in that the inner leads 14b of the lead frame 14 extend to the upper surface of chip 15.

The inner leads 14b are also directly connected with the corresponding bonding pads 15a, without using wires. That is, each inner lead 14b is formed to have a sufficient length so that it can be directly connected with each corresponding bonding pad 15a of the chip 15. Each inner lead 14b is also coated at its free end with a bonding bumper 20, as shown in FIG. 4a. Each bonding bumper 20 is laid on each corresponding bonding pad 15a and then subjected to a heat pressing, so as to achieve an electrical connection between the inner leads 14b and the chip 15, as shown in FIG. 4b.

Subsequent processes are the same as those of FIG. 3 and thus their description and illustration are omitted.

However, the above-mentioned LOC-SOJ type package also has the following problems.

The volume of semiconductor package can be reduced by decreasing the height of a loop formed by each wire in the wire bonding. However, such a decrease in wire loop height may result in a problem that wires are broken. For preventing wires from being broken, it is required to change the material of wires or increase the diameter of wires. However, these methods are undesirable.

As a result, the semiconductor packages requiring wire bonding have the wire loop height higher than the height of inner leads, irrespective of the kind of wires used. Consequently, the height and volume of semiconductor packages increase.

Even in case of directly connecting the inner leads with the bonding pads by means of the bonding bumpers, the semiconductor package has a limitation in reducing its height, due to the thickness of inner leads.

SUMMARY OF THE INVENTION

Therefore, an object of the invention is to eliminate the above-mentioned disadvantages encountered in the conventional semiconductor packages and to provide a semiconductor package in which inner leads of a lead frame have a thickness thinner than that of outer leads, thereby enabling the volume of the package to be reduced and a method for assembling the same.

In one aspect, the present invention provides a semiconductor package including: a semiconductor chip having at its upper surface a plurality of bonding pads; an insulating layer formed over the upper surface of the semiconductor chip except for portions corresponding the bonding pads; a plurality of inner leads each having at its one end a bonding bumper for electrically connecting the inner lead with each corresponding bonding pad; a package body surrounding the semiconductor chip, the insulating layer and the inner leads; and a plurality of outer leads each extending outwardly from the other end of each corresponding inner lead and having a thickness larger than that of the inner lead, each of the outer leads having a predetermined shaped portion disposed outwardly of the package body.

In another aspect, the present invention provides a method for assembling a semiconductor package including the steps of: dicing a wafer to form a plurality of semiconductor chips each having a plurality of bonding pads; preparing a tape lead frame having a paddle on which one of the semiconductor chips is laid, a plurality of inner leads each having a sufficient length to be directly connected with each corresponding bonding pad of the semiconductor chip and a plurality of outer leads each connected with each corresponding inner lead and having a thickness larger than that of the inner lead; die bonding the semiconductor chip on the paddle of the tape lead frame; shaping an insulating layer over the upper surface of the semiconductor chip except for portions corresponding to the bonding pads; connecting electrically one end of each inner lead with each corresponding bonding pad of the semiconductor chip; molding the semiconductor chip, the insulating layer and the inner leads of the tape lead frame except for the outer leads; and shaping each of the outer leads into a predetermined shape.

Further scope of applicability of the present invention will become apparent from the detailed description given hereinafter. However, it should be understood that the detailed description and specific examples, while indicating preferred embodiments of the invention, are given by way of illustration only, since various changes and modifications with the spirit and scope of the invention will become apparent to those skilled in the art from this detailed description.

BRIEF DESCRIPTION OF THE DRAWINGS

Other objects and aspects of the invention will become apparent from the following description of embodiments with reference to the accompanying drawings, which are given by way of illustration only, and thus are not limitative of the present invention and in which:

FIGS. 5a to 5j are schematic sectional views illustrating a method for assembling a semiconductor package in accordance with an embodiment of the present invention.

DETAILED DESCRIPTION OF THE PREFERRED EMBODIMENTS

Figure 1A:
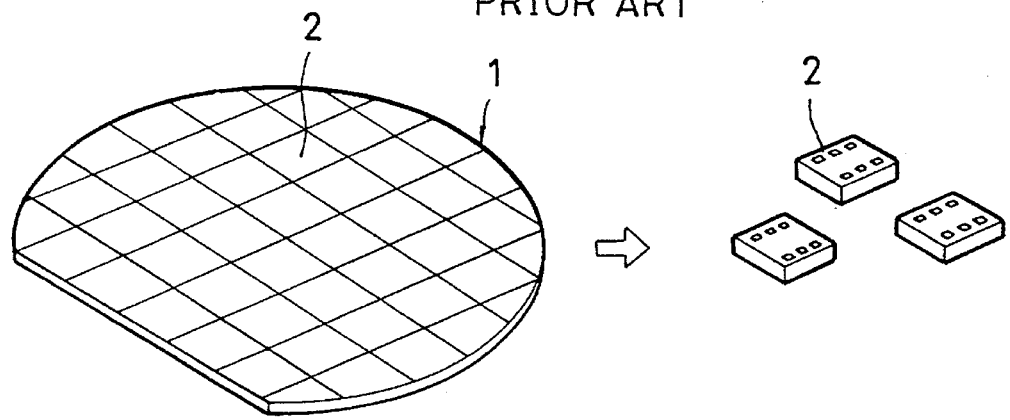
FIGS. 1a to 1i are schematic sectional views illustrating a conventional method for assembling a plastic package.
Figure 1B:
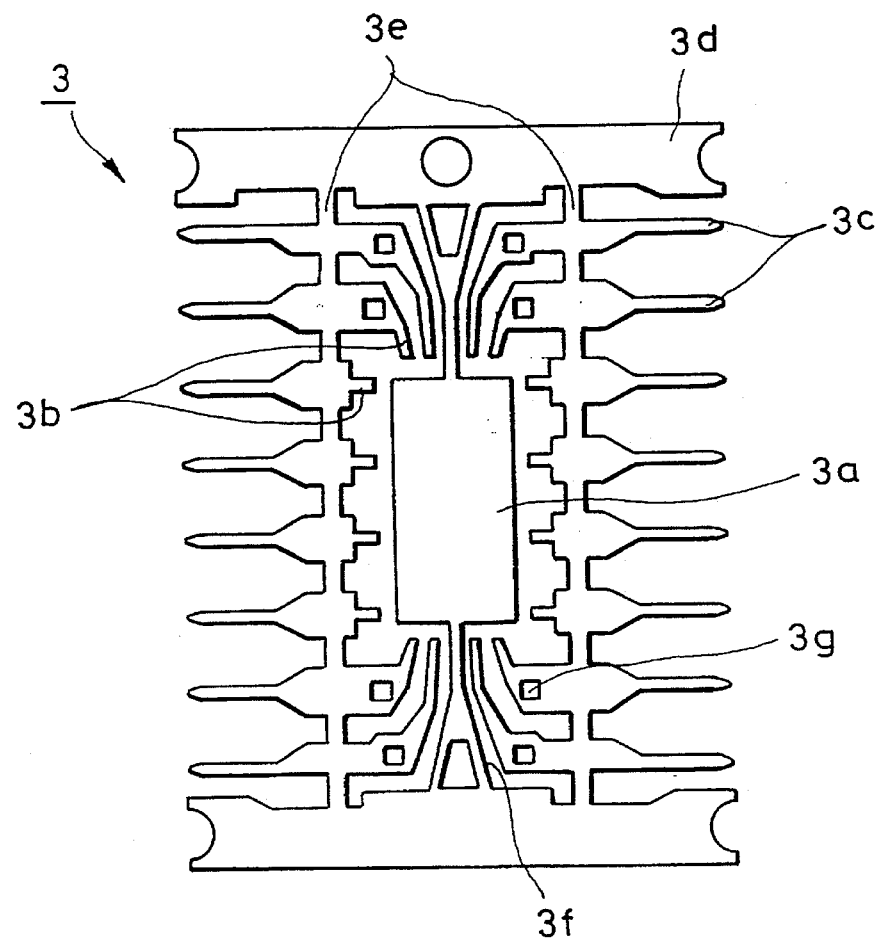
Figure 1C:
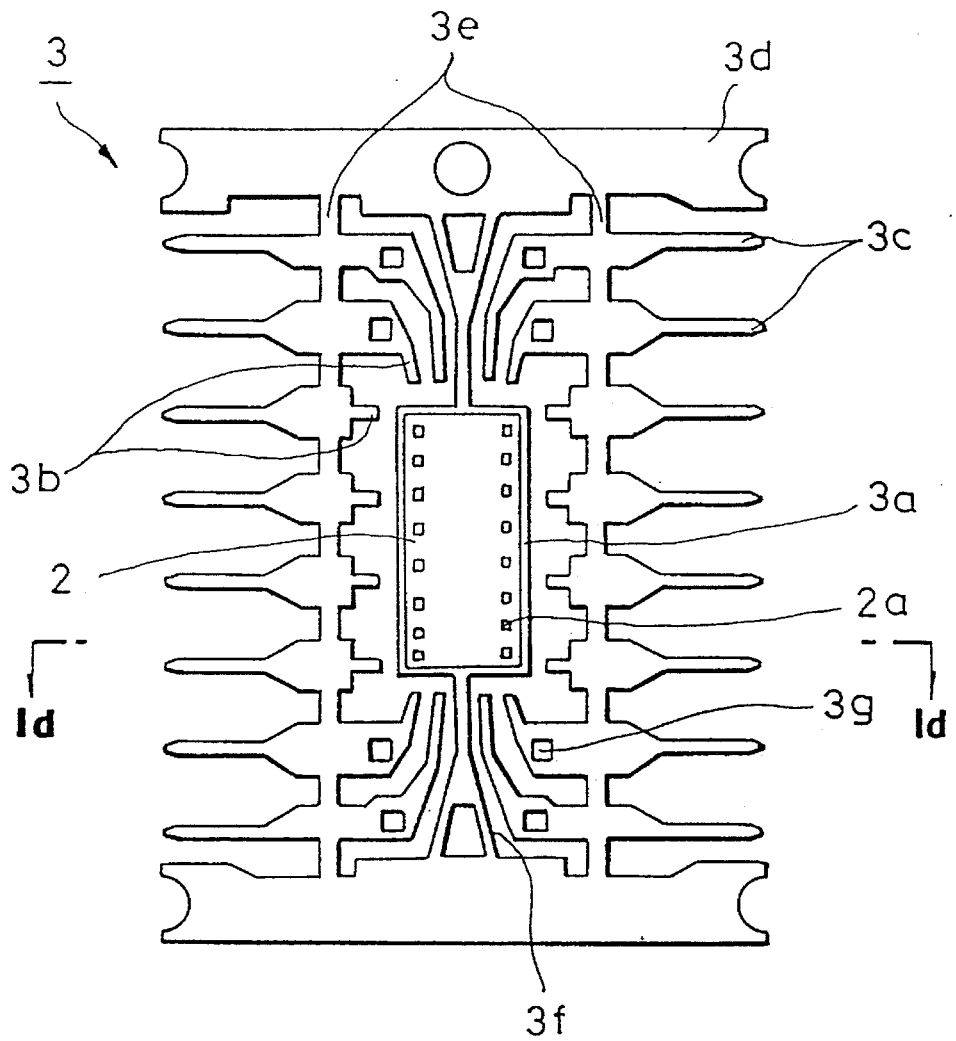
Figure 1D:
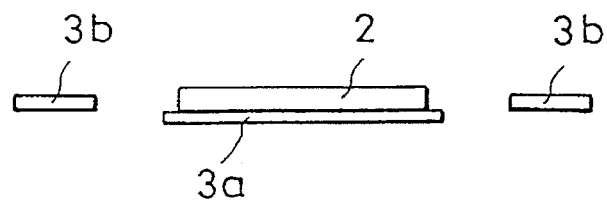
Figure 1E:
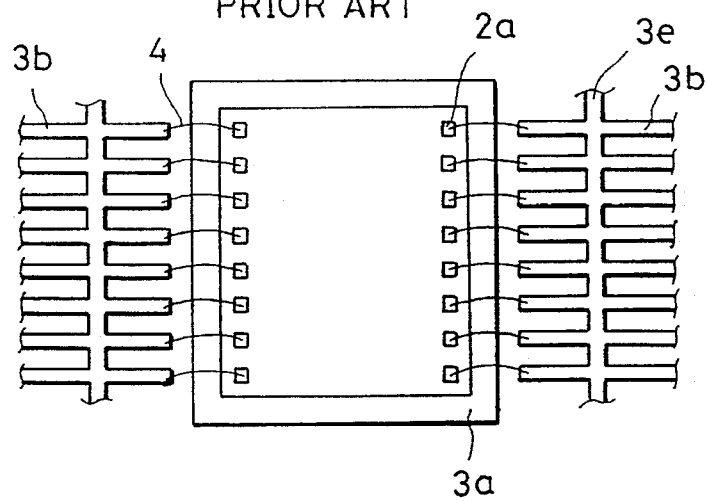
Figure 1F:
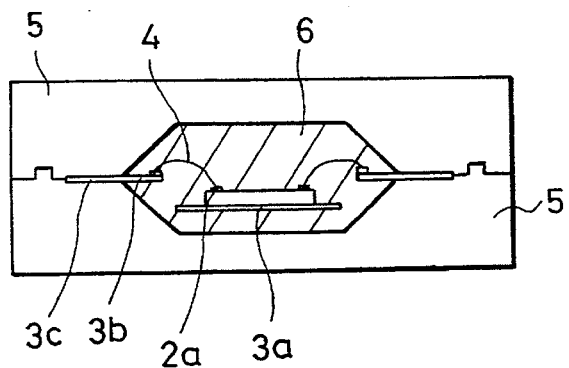
Figure 1G:
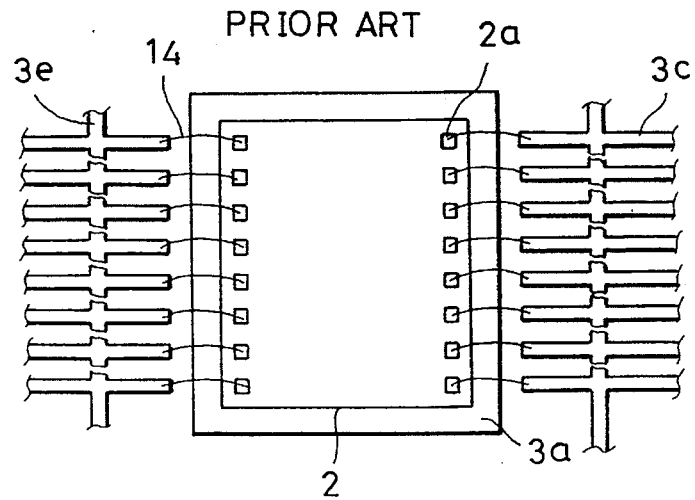
Figure 1H:
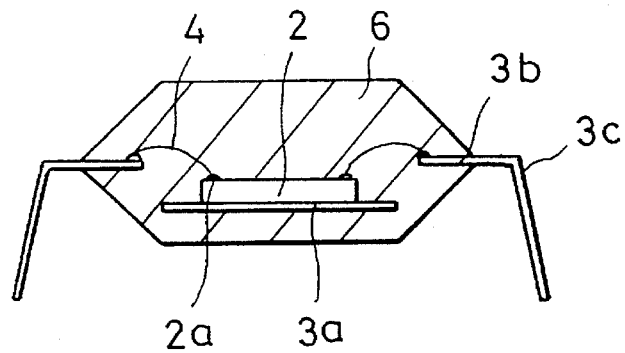
Figure 1I:
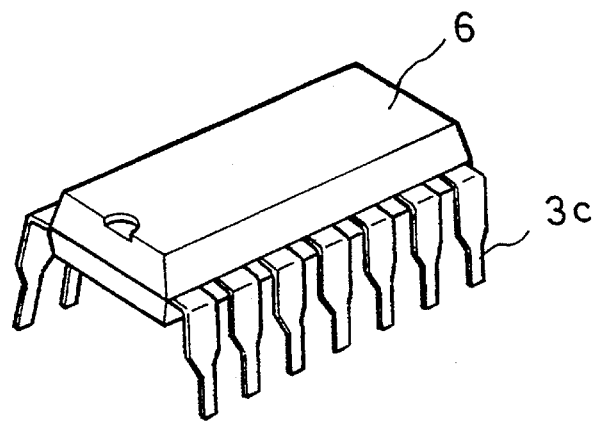
Figure 2A:
FIGS. 2a to 2f are schematic sectional views illustrating a conventional method for assembling a ceramic package.
Figure 2B:
Figure 2C:
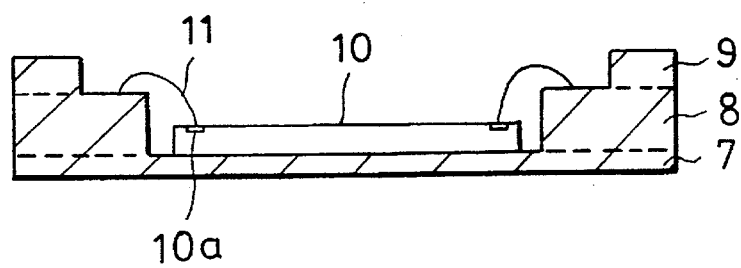
Figure 2D:
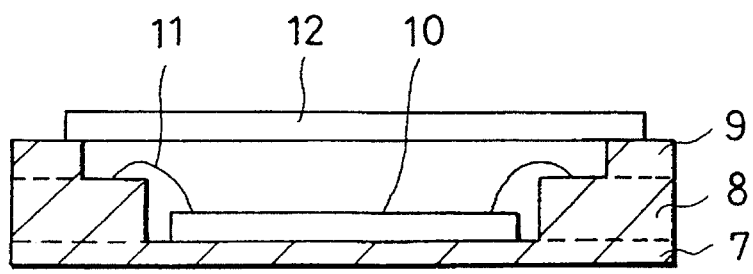
Figure 2E:
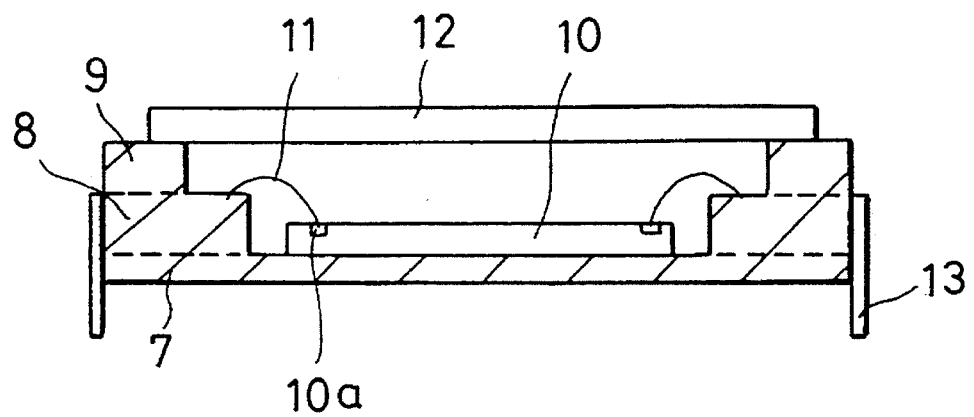
Figure 2F:
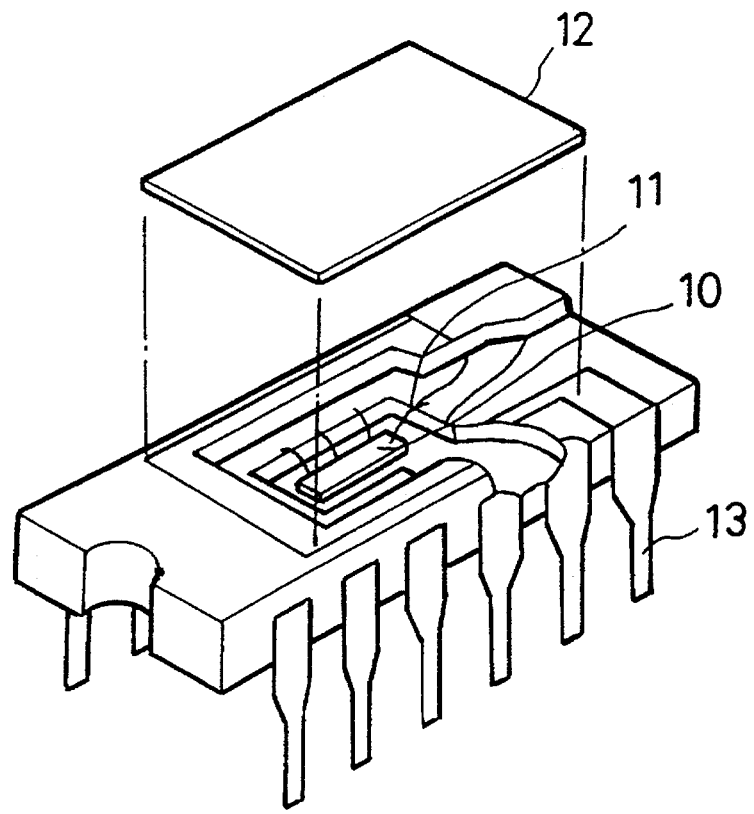
Figure 3B:
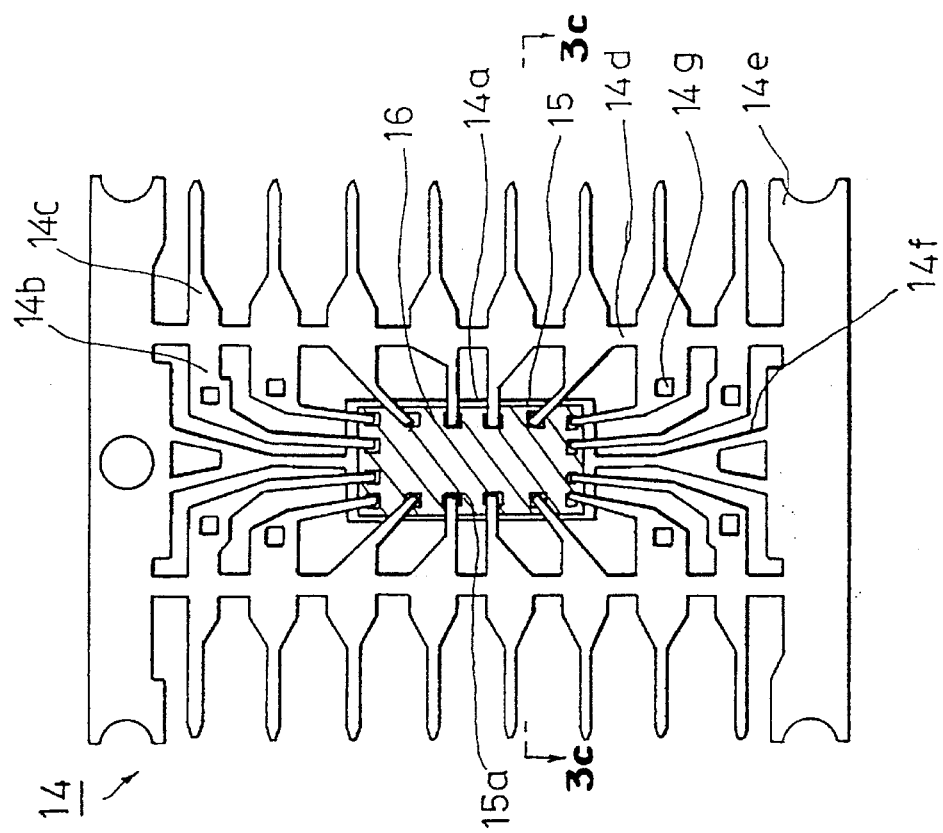
FIGS. 3a to 3f are schematic sectional views illustrating a conventional method for assembling a LOC-SOJ package.
Figure 3A:
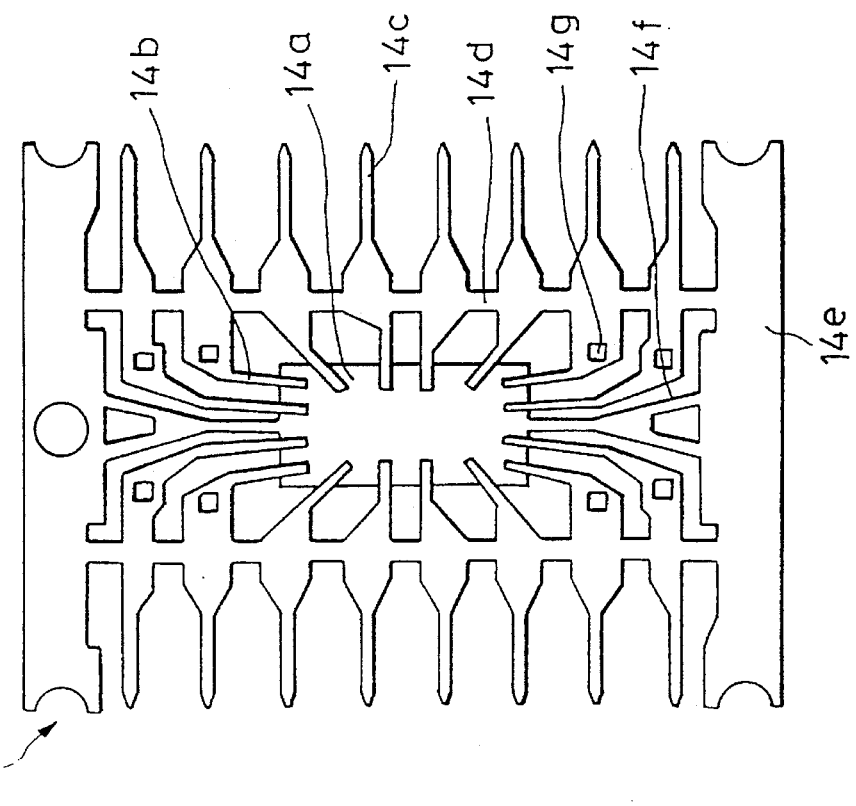
Figure 3C:
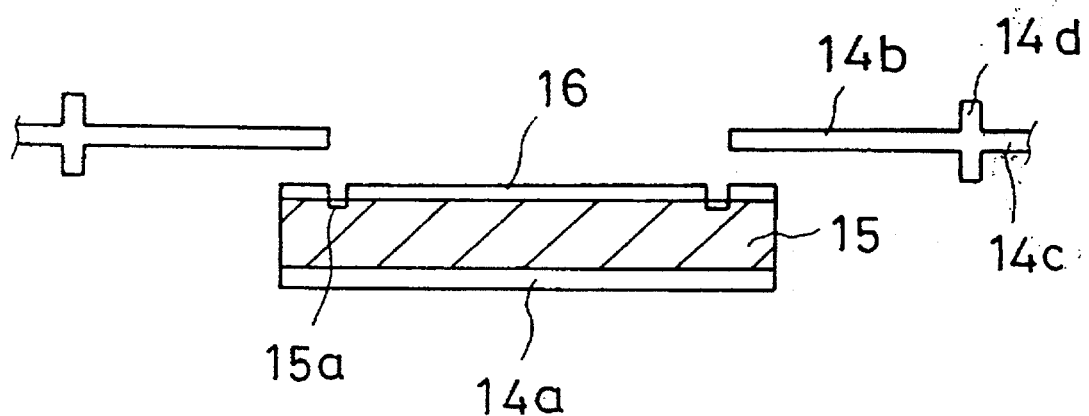
Figure 3D:
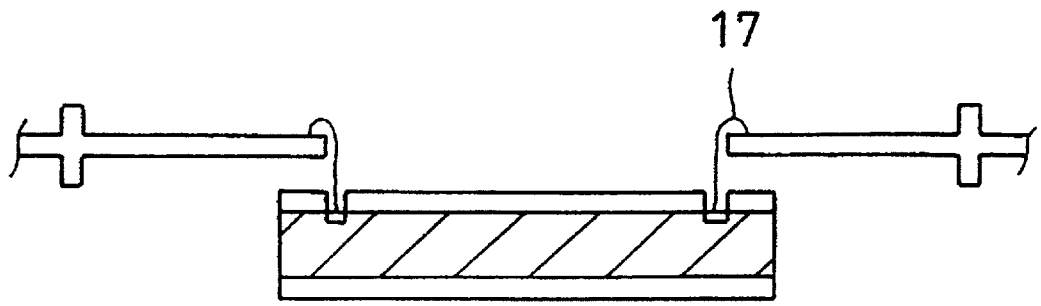
Figure 3E:
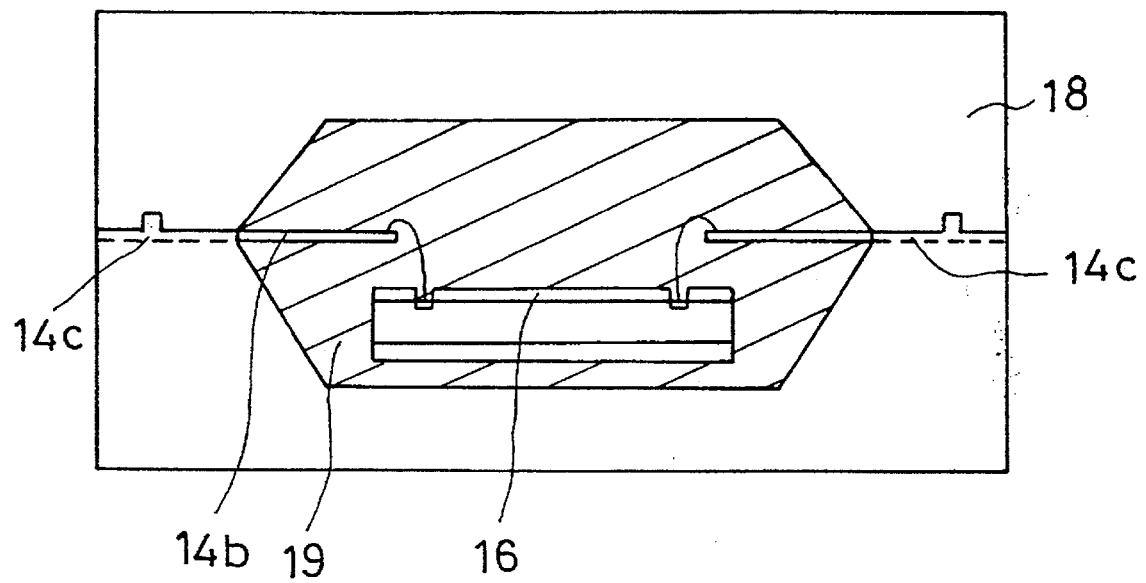
Figure 3F:
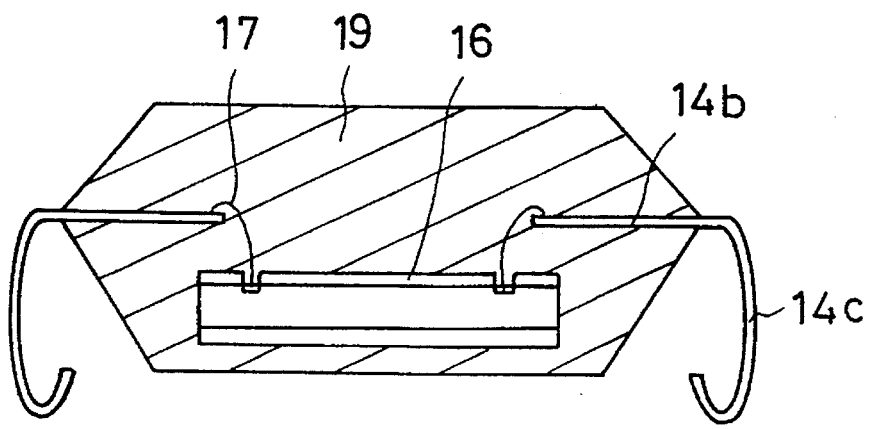
Figure 4A:
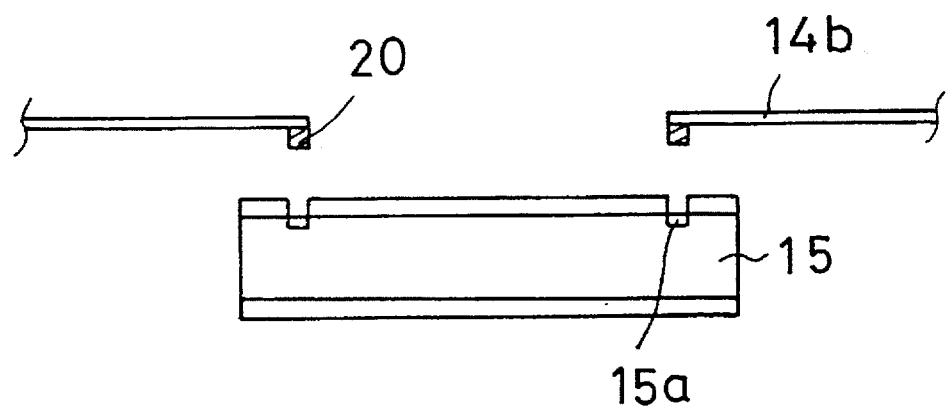
FIGS. 4a and 4b are schematic sectional views illustrating another method for assembling a LOC-SOJ package.
Figure 4B:
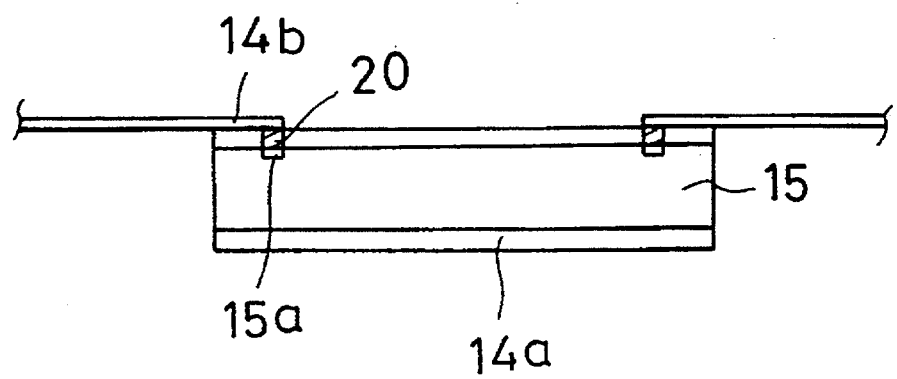

Referring to FIGS. 5a to 6b, there are illustrated methods for assembling a semiconductor package in accordance with different embodiments of the present invention. These embodiments will now be described, in conjunction with the drawings.

First Embodiment

FIGS. 5a to 5j illustrate a method for assembling a semiconductor package in accordance with a first embodiment, of the present invention.

In accordance with the method, a wafer 21 is first subjected to a dicing using a chemical process or a diamond cutter so that it is divided into a plurality of semiconductor chips 22, as shown in FIG. 5a. As shown in FIG. 5b, a tape lead frame 23 is also prepared. The tape lead frame 23 has the same construction as conventional lead frames, except for having a characteristic of a small thickness as that of a tape. That is, the tape lead frame 23 comprises a paddle 23a on which one of the semiconductor chips 22 is laid, a plurality of inner leads 23b electrically connected at their one ends with corresponding bonding pads 22a of the semiconductor chip 2 die-bonded to the paddle 23a, a plurality of outer leads 23c electrically connected with the other ends of inner leads 23b and having a thickness larger than that of inner leads 23b, a pair of spaced side rails 23d adapted to maintain the shape of the lead frame 3, a pair of support bars 23e adapted to support the paddle 23a between the side rails 23d, dam bars 23f adapted to support the inner and outer leads 23b and 23c such that they are uniformly spaced between the side rails 23d, and a plurality of locking holes 23g. The tape lead frame shown in FIG. 5b has a construction modified from that of a tape lead frame for a tape auto bonding (TAB).

In the illustrated embodiment, the ratio between the thickness of each inner lead 23b and the thickness of each outer lead 23c is 1:8 to 1:10. As the outer leads 23c are formed to have a thickness larger than that of inner leads 23b by 8 to 10 times, mechanical stability is achieved.

Now, a method for making the tape lead frame 23 will be described.

A plate of a copper-nickel alloy (42% nickel) is first prepared. The plate is subjected to pressings under different pressures at its portions at which inner leads are formed and its portions at which outer leads are formed, respectively, so that the portions for forming inner leads are thinner than the portions for forming outer leads.

The plate is then subjected to a photoing process and a chemical etching process, so as to remove unnecessary portions therefrom. Thus, a pattern for the tape lead frame 23 is formed at the plate. In this case, the formation of the pattern is carried out such that each inner lead 23b has a sufficient length to directly connect its one end with each corresponding bonding pad 22a of the semiconductor chip 22.

The material of the tape lead frame 23 may comprise a copper-iron alloy or copper-tin alloy.

As apparent from the above description, the tape lead frame according to the present invention has inner leads 23b having a thickness and a pitch smaller than those of inner leads of conventional lead frames and outer leads 23c having a thickness and a pitch approximately equal to those of outer leads of conventional lead frames.

Figure 5C:
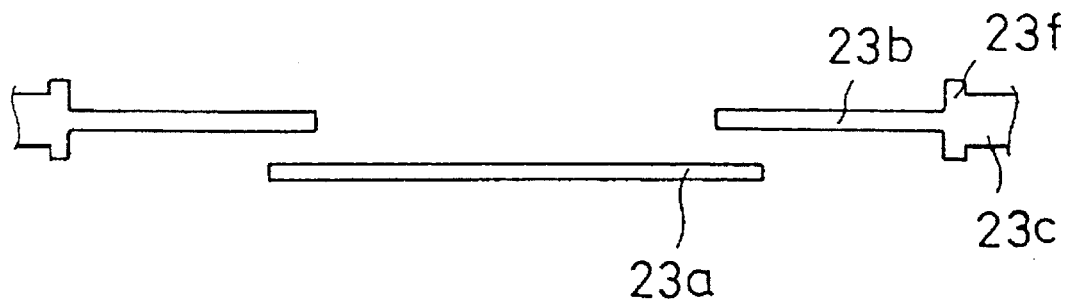

FIG. 5c is a cross-sectional view taken along the line a—a' of FIG. 5b.

Figure 5D:
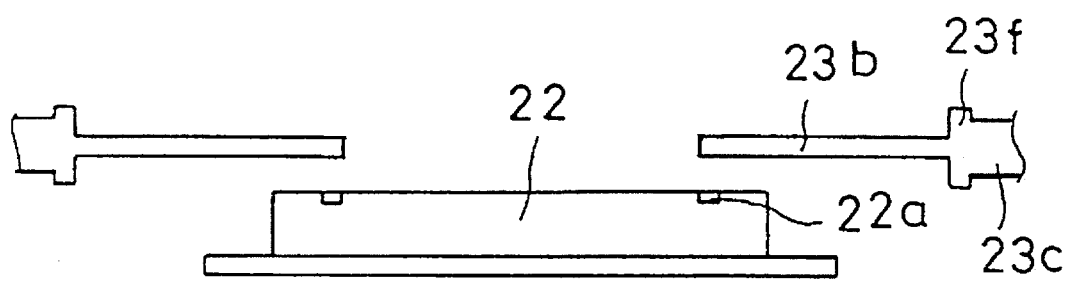

Thereafter, the semiconductor chip 22 is laid on the paddle 23a of the tape lead frame 23 and a die bonding is then carried out for attaching the semiconductor chip 22 to the paddle 23a, as shown in FIGS. 5d. Prior to the laying of semiconductor chip 22, the tape lead frame 23 is subjected to a surface processing which involves a dipping of the tape lead frame 23 in a solution of NaOH or KOH for 5 to 10 minutes. After such a surface processing, the die bonding can make the paddle 23a adhere to the semiconductor chip 22 strongly.

The die bonding is carried out as follows.

The paddle 23a is first coated with a coating of a gold-antimony alloy. Thereafter, the semiconductor chip 22 is laid on the paddle 23 and subjected to an annealing at a temperature ranging from 300° C. to 400° C. By the annealing, the gold-antimony alloy forms the same crystals as that of the semiconductor chip 22 and thus adheres to the semiconductor chip 22.

The annealing temperature may be varied depending on the kind of the soldering material used. In case of using the gold-antimony alloy requiring a high annealing temperature of 300° C. to 400° C., the annealing is carried out in an inert gas atmosphere, so as to avoid the semiconductor chip 22 and paddle 23a from being oxidized.

Otherwise, the die bonding may be achieved by a bonding method using a conductive adhesive, a soldering method using a soldering material of lead-tin (Pb-Sn) alloy, or a method using a soldering glass.

Figure 5E:
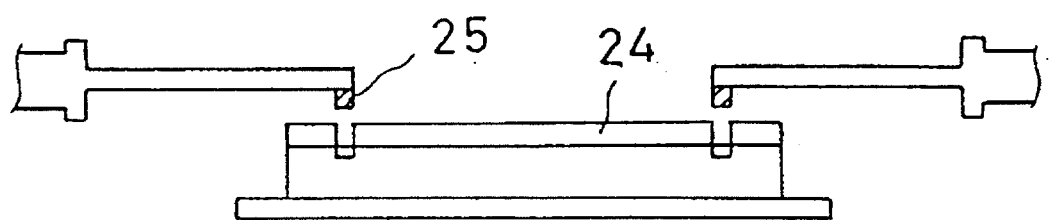
Figure 5F:
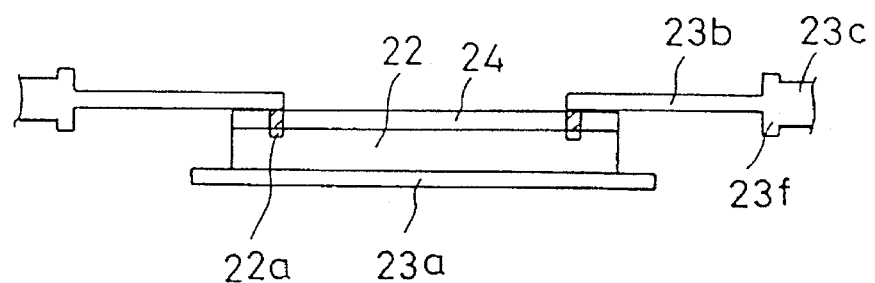

Subsequently, the semiconductor chip 22 is coated with an insulating layer 24, at its upper surface except for portions corresponding to the bonding pads 22a, as shown in FIG. 5e. The one end of each inner lead 23b is then coated with an gold (Au) bumper 25. As shown in FIG. 5f, each gold bumper 25 is laid on each corresponding bonding pad 22a of the semiconductor chip 22 and then subjected to a heat pressing, so as to achieve an electric connection between each inner lead 23b and the semi conductor chip 22.

In place of the heat pressing, other methods may be used which include a method using ultrasonic waves, a soldering method, or a method using electron beams.

Figure 5G:
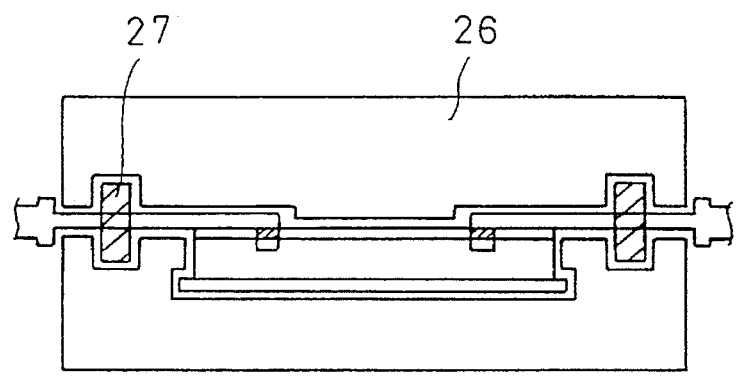

Thereafter, a molding is carried out. During molding, the space between adjacent inner leads 23b may be varied since the inner leads 23b have a small thickness. For avoiding this phenomenon, the center portions of inner leads 23b are first molded in a mold 26. In FIG. 5g, the reference numeral 27 denotes a mold body primarily molded at the center portions of inner leads 23b. Although dam bars 23f are provided, they can hardly maintain the space between adjacent inner leads and the space between adjacent outer leads, upon the molding for forming a package body.

Figure 5H:
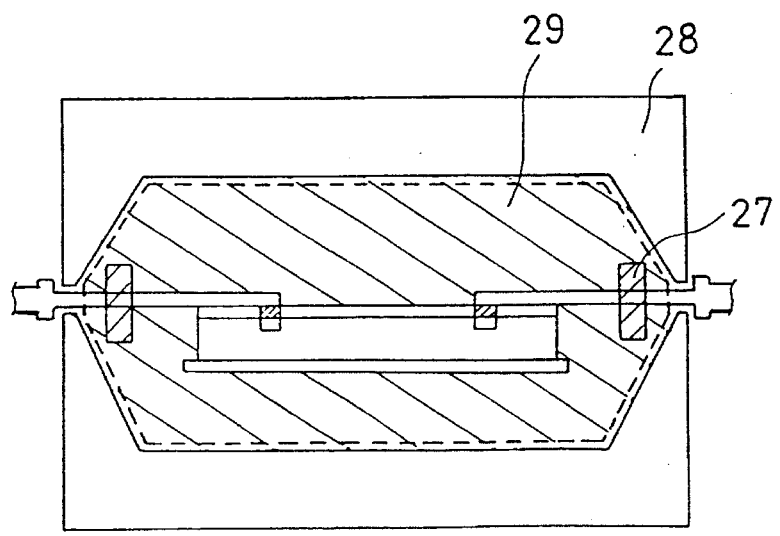

Thereafter, an epoxy molding compound is charged into the mold cavity of the mold 28 in which the tape lead frame 23 except for outer leads 23c and the semiconductor chip 22 are disposed and a molding is then carried out for forming a package mold body 29, as shown in FIG. 5h. Accordingly, the package mold body 29 has a shape surrounding the semiconductor chip 22 and the tape lead frame 23 except for the outer leads 23c and the dam bars 23f.

Figure 5I:
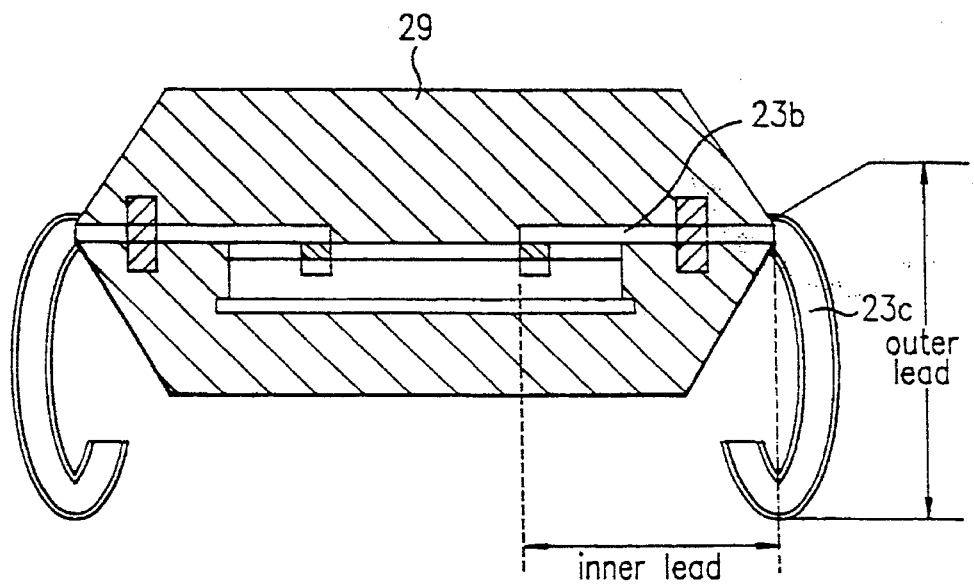
Figure 5J:
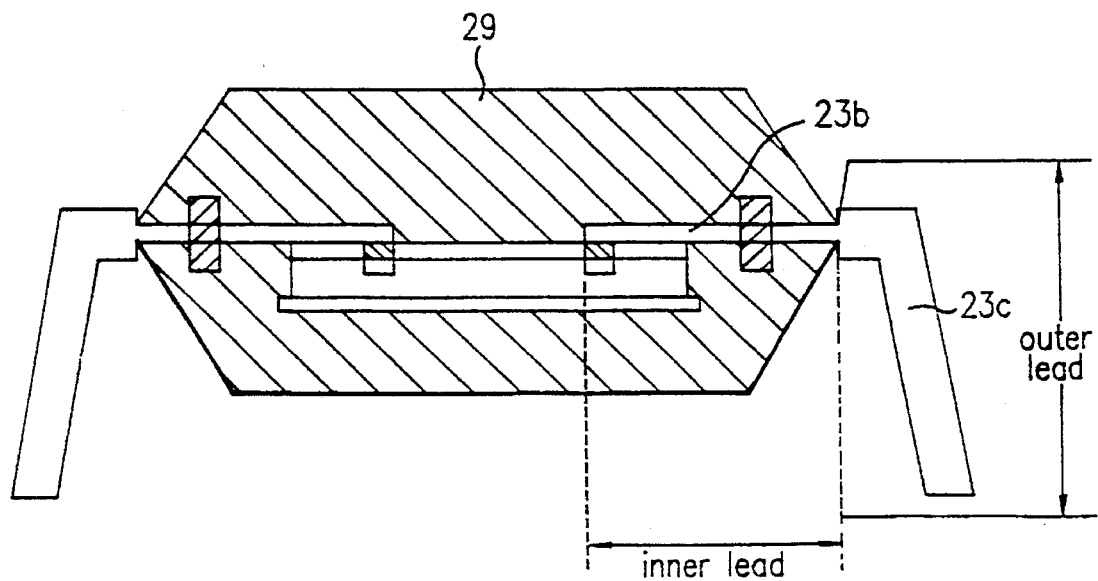

After molding, a trimming is carried out for removing dam bars 23f from the molded package, as shown in FIG. 5h. Subsequently, a shaping process for shaping the outer leads 3c into a J-shape is performed as shown in FIG. 5i. Thus, all processes for assembling the LOC-SOJ package are completed. By the shaping process, the outer leads 23c may be shaped to have a gull wing shape as illustrated in FIG. 5j.

Second Embodiment

Figure 6A:
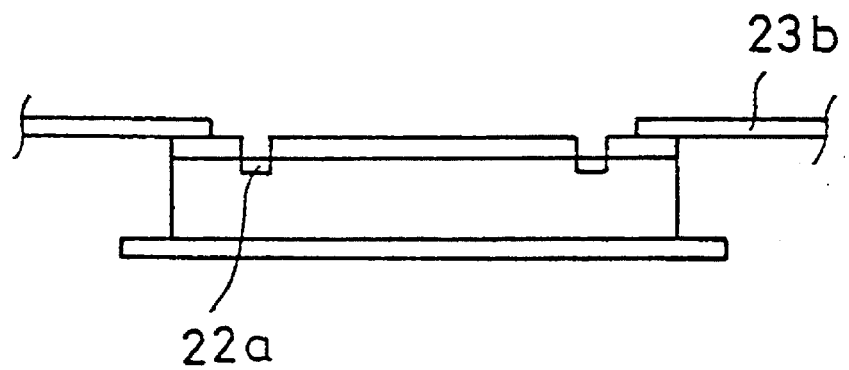
FIGS. 6a and 6b are schematic sectional views illustrating a method for assembling a semiconductor package in accordance with another embodiment of the present invention.
Figure 6B:
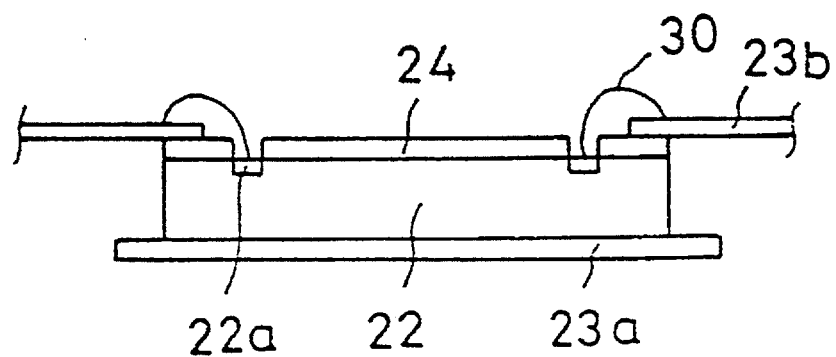

FIGS. 6a and 6b illustrate a method for assembling a semiconductor package in accordance with a second embodiment of the present invention.

This embodiment is different from the first embodiment, in that the inner leads are electrically connected with the bonding pad, by means of conventional wires, without using gold bumpers. For wire bonding, the length of each inner lead in this embodiment is shorter than that of each inner lead in the first embodiment. That is, the length of each inner lead 23b of the tape lead frame 23 should be determined such that one end of each inner lead 23b does not reach each corresponding bonding pad 22a of the semiconductor chip 22 laid on the paddle 23a of tape lead frame 23, as shown in FIG. 6a.

After die bonding for attaching the semiconductor chip 22 to the paddle 23a, a wire bonding is carried out for wire bonding one end of each corresponding inner lead 23b with each bonding pad 22a of the semiconductor chip 22 with by means of a wire 30, as shown in FIG. 6b. Thus, an electrical connection between the semiconductor chip 22 and the inner leads 23b is achieved.

The wire bonding can be accomplished by using a heat pressing method, a method using ultrasonic waves, a soldering method, or a method using electron beams.

As above-mentioned, the second embodiment is the same as the first embodiment, except for the use of wires in place of Au bumpers, for the electrical connection between the semiconductor chip and the inner leads. Accordingly, further description and illustration of the second embodiment is omitted.

As apparent from the above description, the present invention provides the following effects:

First, the semiconductor package obtained by the present invention can be reduced in thickness and volume, in that the thickness of inner leads disposed in a package body and electrically connected with a semiconductor chip is smaller than that of outer leads disposed outwardly of the package body and electrically connected with other elements; and Second, it is possible to eliminate the use of wires by virtue of the use of bumpers, thereby enabling the rate of poor products caused by a wire sweeping phenomenon to be reduced and thus the manufacture cost to be reduced.

Although the preferred embodiments of the invention have been disclosed for illustrative purpose, those skilled in the art will appreciate that various modifications, additions and substitutions are possible, without departing from the scope and spirit of the invention as disclosed in the accompanying claims.

What is claimed is:

1. A semiconductor package comprising:
   a semiconductor chip having at its upper surface a plurality of bonding pads;
   an insulating layer formed over the upper surface of the semiconductor chip, the insulating layer having open portions corresponding to the bonding pads;
   a plurality of inner leads, each having at a respective first end a bonding bumper for electrically connecting the inner lead with a respective bonding pad through the open portions of the insulating layer;
   a plurality of outer leads, each extending immediately from a respective second end of a corresponding inner lead, each of the outer leads having a uniform thickness greater than that of the inner leads and a predetermined shaped portion;
   a mold body molded substantially at center portions of the inner leads, the mold body surrounding substantially the center portions of the inner leads, excluding the semiconductor chip, to maintain space between the inner leads and space between the outer leads; and
   a package body being molded and encapsulating the semiconductor chip, the inner leads and the mold body, excluding the outer leads.

2. The semiconductor package in accordance with claim 1, wherein a material of the bonding bumpers is gold.

3. The semiconductor package in accordance with claim 1, wherein the package body is an epoxy molding compound.

4. The semiconductor package in accordance with claim 1, wherein the predetermined shaped portion of each outer lead has a J-shape.

5. The semiconductor package in accordance with claim 1, wherein the predetermined shaped portion of each outer lead has a gull wing shape.

6. The semiconductor package in accordance with claim 1, wherein the inner leads and the outer leads are materials selected from a group including a copper-iron alloy, a copper-nickel alloy and a copper-tin alloy.

7. The semiconductor package in accordance with claim 1, wherein the plurality of inner leads and the plurality of outer leads are dipped in KoH and NaOH to provide good adhesive power.

8. The semiconductor package in accordance with claim 1, wherein the thickness of each of the outer leads is eight to ten times greater than that of the inner leads.

9. The semiconductor package in accordance with claim 1, wherein the mold body is positioned substantially perpendicular to the inner leads.

10. The semiconductor package in accordance with claim 9, wherein the mold body has a substantially rectangular configuration.

11. A semiconductor package comprising:
    a semiconductor chip having at its upper surface a plurality of bonding pads;
    an insulating layer formed over the upper surface of the semiconductor chip, the insulating layer having open portions corresponding to the bonding pads;
    a plurality of inner leads, each having at a respective first end a wire for electrically connecting the inner lead with a respective bonding pad through the open portions of the insulating layer;
    a plurality of outer leads, each extending immediately from a respective second end of a corresponding inner lead, each of the outer leads having a uniform thickness greater than that of the inner leads and a predetermined shaped portion;
    a mold body molded substantially at center portions of the inner leads, the mold body surrounding substantially the center portions of the inner leads, excluding the semiconductor chip, to maintain space between the inner leads and space between the outer leads; and
    a package body being molded and encapsulating the semiconductor chip, the inner leads and the mold body, excluding the outer leads.

12. The semiconductor package in accordance with claim 11, wherein the package body is an epoxy molding compound.

13. The semiconductor package in accordance with claim 11, wherein the predetermined shaped portion of each outer lead has a J-shape.

14. The semiconductor package in accordance with claim 11, wherein the predetermined shape portion of each outer lead has a gull wing shape.

15. The semiconductor package in accordance with claim 11, wherein the inner leads and the outer leads materials are selected from a group including a copper-iron alloy, a copper-nickel alloy and a copper-tin alloy.

16. The semiconductor package in accordance with claim 11, wherein the plurality of inner leads and the plurality of outer leads are dipped in KoH and NaOH to provide adhesive power.

17. The semiconductor package in accordance with claim 11, wherein the thickness of each of the outer leads is eight to ten times greater than that of the inner leads.

18. The semiconductor package in accordance with claim 11, wherein the mold body is positioned substantially perpendicular to the inner leads.

19. The semiconductor package in accordance with claim 18, wherein the mold body has a substantially rectangular configuration.

20. The semiconductor package in accordance with claim 19, wherein the thickness of each of the outer leads is approximately eight to ten times greater than that of each of the inner leads.

* * * * *